(12) United States Patent
Takaba

(10) Patent No.: US 8,778,810 B2
(45) Date of Patent: Jul. 15, 2014

(54) PLASMA TREATMENT METHOD

(75) Inventor: Hiroyuki Takaba, Tokyo (JP)

(73) Assignee: Tokyo Electron Limited, Tokyo (JP)

(*) Notice: Subject to any disclaimer, the term of this patent is extended or adjusted under 35 U.S.C. 154(b) by 64 days.

(21) Appl. No.: 13/380,843

(22) PCT Filed: Jun. 25, 2010

(86) PCT No.: PCT/US2010/001832
§ 371 (c)(1),
(2), (4) Date: Dec. 25, 2011

(87) PCT Pub. No.: WO2010/151336
PCT Pub. Date: Dec. 29, 2010

(65) Prior Publication Data
US 2012/0098147 A1    Apr. 26, 2012

Related U.S. Application Data

(60) Provisional application No. 61/269,686, filed on Jun. 26, 2009.

(51) Int. Cl.
*H01L 21/26*    (2006.01)

(52) U.S. Cl.
USPC .......................................... 438/761

(58) Field of Classification Search
USPC ................ 438/623, 761, 798, 653, 777
See application file for complete search history.

(56) References Cited

U.S. PATENT DOCUMENTS

| | | | |
|---|---|---|---|
| 6,127,004 A * | 10/2000 | Hatwar et al. | 427/535 |
| 6,215,087 B1 | 4/2001 | Akahori et al. | |
| 6,528,865 B1 | 3/2003 | Banerjee | |
| 6,534,616 B2 | 3/2003 | Lee et al. | |
| 6,537,904 B1 | 3/2003 | Ishizuka | |
| 6,770,332 B2 | 8/2004 | Nakase et al. | |
| 8,278,205 B2 * | 10/2012 | Matsuoka | 438/622 |
| 2009/0085172 A1 | 4/2009 | Horigome et al. | |
| 2009/0134518 A1 | 5/2009 | Horigome | |

FOREIGN PATENT DOCUMENTS

| | | |
|---|---|---|
| EP | 1035569 B1 | 10/2006 |
| TW | 200839871 A | 10/2008 |

OTHER PUBLICATIONS

United States Patent and Trademark Office, International Search Report and Written Opinion of corresponding PCT Application No. PCT/US10/01832, dated Sep. 2, 2010, 11 pages.

Taiwan Intellectual Property Office, Notification of Examination Opinions for corresponding Taiwan Patent Application No. 99120840, issued on Mar. 15, 2013, 7 pages.

* cited by examiner

*Primary Examiner* — Hoa B Trihn

(57) ABSTRACT

A method for manufacturing a semiconductor device having fluorocarbon layers as insulating layers includes the steps of forming a first fluorocarbon (CFx$_1$) layer using plasma excited by microwave power and forming a second fluorocarbon (CFx$_2$) layer using plasma excited by an RF power.

24 Claims, 11 Drawing Sheets

PLASMA TREATMENT METHOD

This application claims priority from U.S. provisional application Ser. No. 61/269,686, filed Jun. 26, 2009, entitled "Plasma Treatment Method," which is incorporated herein by reference in its entirety.

TECHNICAL FIELD

The present invention relates to semiconductor devices and their manufacturing methods. More specifically, it relates to a fluorocarbon (CFx) forming process for improving the adhesiveness of CFx layer with other metal or insulating layers while maintaining a low value of permittivity for the fluorocarbon (CFx) layer.

BACKGROUND OF THE INVENTION

In recent years, multilayer interconnection structures have been employed to achieve high speed operation and miniaturization of semiconductor devices. However, these structures have raised the problem of wiring delay due to an increase in the overall wiring resistance and parasitic capacitance of the wiring layers.

The use of low resistance wiring material, e.g., copper (Cu), as the interconnection body reduces the wiring resistance. On the other hand, the use of low permittivity or low-k materials, e.g., fluorine added carbon (fluorocarbon: CFx), as the insulating layer reduces the parasitic capacitance. However, despite the convenience of lowering the parasitic capacitance of the multilayer interconnection structures, the fluorocarbon (CFx) layers have not yet been widely used as a part of electronic circuits in semiconductor devices. This is mainly due to the fact that the number of insulating layers or metal layers exhibiting a good adhesion property while stacked on a surface of the fluorocarbon (CFx) layer is considerably restricted.

When fluorocarbon (CFx) is used as the material for insulating layers, the fluorine contained in the fluorocarbon (CFx) layer causes fluorination reaction at the interface between the fluorocarbon (CFx) layer and other metal or insulating layers. As a result, the adhesiveness between the CFx layer and other metal or insulating layers deteriorates due to generation of fluorine compounds at their interface. It is also assumed that the existence of fluorine compounds, including fluorine ions, within the fluorocarbon (CFx) layer is the major reason for the restricted number of insulating layers or metal layers that may exhibit good adhesion properties at higher temperature regions (more than 350° C.) while stacked on the surface of the fluorocarbon (CFx) layer.

A process for reducing fluorine compounds of the fluorocarbon (CFx) layer is proposed in Japanese Patent Application Publication No. 2006-326041. In this process, a compositional ratio of fluorine to carbon in the fluorocarbon layer (F/C) is reduced by applying a high-frequency (RF) power into the microwave plasma process, which has already been generated for forming the fluorocarbon (CFx) layer. However, similar to the conventional process, fluorine compounds still remain near the surface of the fluorocarbon (CFx) layer after deposition. Therefore, it affects greatly the adhesiveness of the fluorocarbon (CFx) layer with other insulating or metal layers.

The present invention is proposed in view of the above aforementioned problems. The present invention provides a process for forming a fluorocarbon (CFx) layer to suppress the fluorine compounds desorption at higher temperature regions, more than 350° C., while maintaining a low value of permittivity (k: less than 2.6).

SUMMARY OF THE INVENTION

In accordance with one aspect of the present invention, there is provided a method for manufacturing a semiconductor device having fluorocarbon layers as insulating layers. The method includes the steps of: forming a first fluorocarbon ($CFx_1$) layer using a plasma excited by microwave power; and forming a second fluorocarbon ($CFx_2$) layer using a plasma excited by RF power.

In accordance with a second aspect of the present invention, there is provided a semiconductor device including: a first fluorocarbon ($CFx_1$) layer and a second fluorocarbon ($CFx_2$) layer, wherein a compositional ratio of fluorine to carbon in the second fluorocarbon layer ($F_2/C_2$) is smaller than the compositional ratio of fluorine to carbon in the first fluorocarbon layer ($F_1/C_1$).

In accordance with a third aspect of the present invention, there is provided a method for forming fluorocarbon layers using a plasma reaction process. The method comprising the steps of: forming a first fluorocarbon ($CFx_1$) layer using a plasma excited by microwave power; and forming a second fluorocarbon ($CFx_2$) layer using a plasma excited by RF power.

DETAILED DESCRIPTION OF INVENTION

Figure 1:
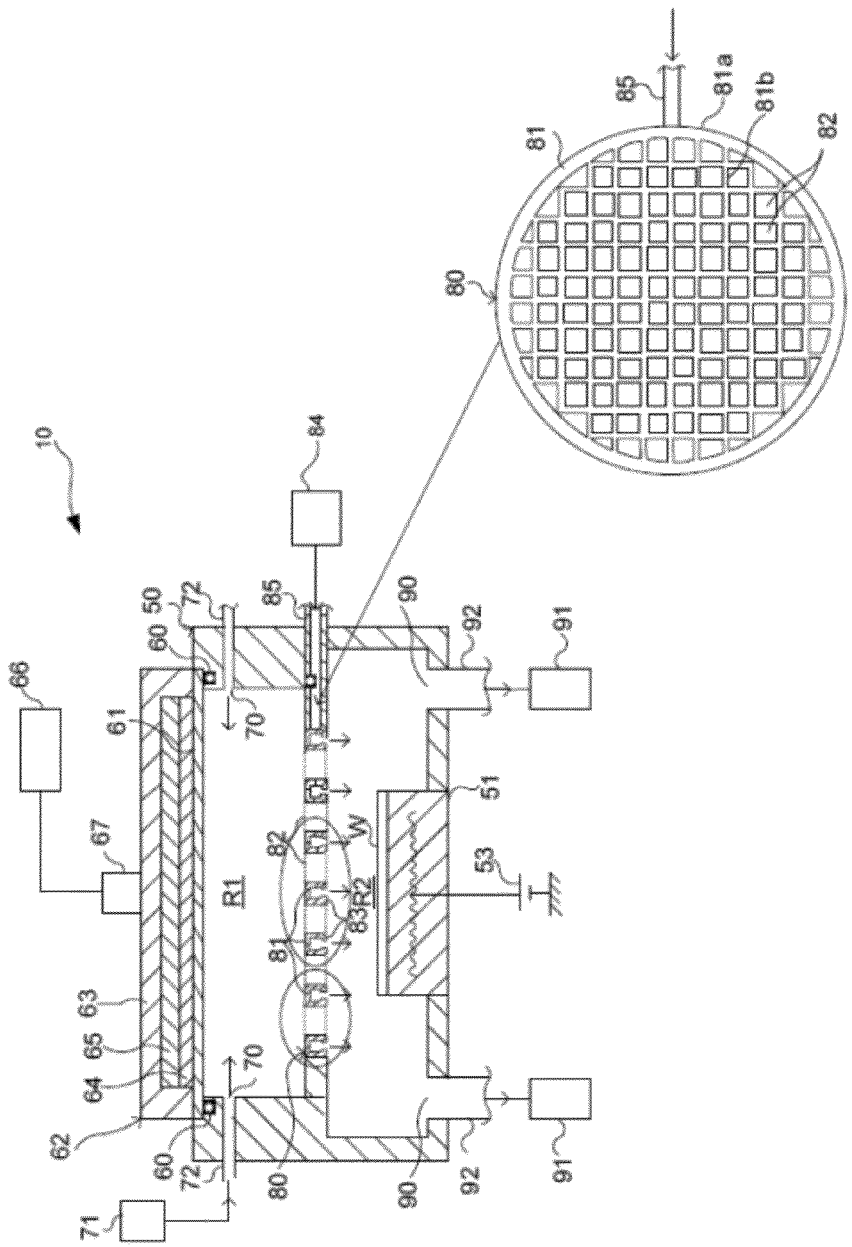
FIG. 1 depicts a schematic diagram of an embodiment of a radial line slot antenna (RLSA) plasma treatment device.

Embodiments of the present invention will be described hereinafter with reference to the accompanying drawings, in which preferred exemplary embodiments of the invention are shown. The ensuing description is not intended to limit the scope, applicability or configuration of the disclosure. Rather, the ensuing description of the preferred exemplary embodiments will provide those skilled in the art with an enabling description for implementing preferred exemplary embodiments of the disclosure. It should be noted that this invention may be embodied in different forms without departing from the spirit and scope of the invention as set forth in the appended claims.

This disclosure relates in general to semiconductor devices and their manufacturing process. More specifically, it relates to a new fluorocarbon (CFx) forming process for improving the adhesiveness of fluorocarbon (CFx) layer with other metal or insulating layers while maintaining a low value of permittivity.

Embodiments of the present invention are directed to a process for forming a fluorocarbon (CFx) insulating layer with enhanced adhesion properties to suppress desorption of fluorine compounds at temperatures higher than 350° C. while maintaining a low value of permittivity (k: less than about 2.6). This is achieved by selecting a first predetermined process condition for forming a first fluorocarbon ($CFx_1$) layer using plasma excited by microwave power and by selecting a second process conditions for forming a second fluorocarbon ($CFx_2$) layer using plasma excited by an RF power.

In this way, the effective relative permittivity of the fluorocarbon (CFx) layer, formed according to the process of the present invention, remains low while the unintentional formation of the fluorine compounds at the interface between the fluorocarbon (CFx) layer and other metal or insulating layers is suppressed.

By selecting the first predetermined process condition, a microwave-excited plasma is generated to form the first fluorocarbon ($CFx_1$) layer according to an embodiment of the present invention. The first fluorocarbon ($CFx_1$) layer is formed using a radial line slot antenna (RLSA) plasma treatment device. The microwave-excited plasma is generated when the applied microwave power is greater than 1000 W. This is true even if a high RF power is applied to the target electrode of the RLSA plasma treatment device. In the preferred embodiment, the applied microwave power ranges from 1200 W to 3000 W and the applied RF power ranges from 0 W to 120 W.

Further, the first predetermined process condition may include a pressure ranging from 20 mTorr to 80 mTorr and a process time ranging from 20 to 150 seconds. In this embodiment, a plasma excitation gas such as argon (Ar) gas with a flow rate which is less than or equal to 200 sccm and a film forming process gas such as $C_5F_8$ gas with a flow rate ranging from about 150 sccm to 750 sccm are used respectively for generating the plasma and forming the first fluorocarbon ($CFx_1$) layer with a thickness of about 100 nm.

By selecting the second predetermined process condition, an RF-excited plasma is generated to form the second fluorocarbon ($CFx_2$) layer. The second predetermined process condition may include a microwave power ranging from 0 W to 1000 W, an applied RF power ranging from 15 W to 120 W, and a processing time ranging from 5 to 60 seconds. In the preferred embodiment, the second fluorocarbon ($CFx_2$) layer is formed by setting the microwave power to 0 W and generating the plasma by only RF power. This is mainly due to the fact that damages to the underlying layers get stronger if microwave power is applied in combination with the RF plasma. In this embodiment, the thickness of the second fluorocarbon ($CFx_2$) layer is about 1 nm to 10 nm.

Further, similar to the first predetermined process condition, the pressure inside of the RLSA plasma treatment device, the flow rate of plasma excitation gas, and the flow rate of film forming process gas are set, respectively, to a pressure ranging from 20 mTorr to 80 mTorr, an argon (Ar) flow rate which is less than or equal to 200 sccm, and a $C_5F_8$ flow rate ranging from about 150 sccm to 750 sccm. The above-mentioned pressure range ensures a stable RF plasma generation and fluorocarbon (CFx) deposition. The second fluorocarbon ($CFx_2$) layer may be formed in the same processing chamber of the RLSA plasma treatment device used for forming the first fluorocarbon ($CFx_1$) layer.

When the microwave-excited plasma is used to form the first fluorocarbon ($CFx_1$) layer, the resulting layer may be formed without causing excessive desorption of the film forming process gas, e.g., $C_5F_8$ gas. This is mainly due to the fact that the microwave-excited plasma has a low electron temperature which prevents the excessive destruction of carbon bonds within the $C_5F_8$ gas. Therefore, the first fluorocarbon ($CFx_1$) layer is a strong layer that exhibit diamond-like properties having substantially the same numbers of fluorine and carbon atoms with a low value of permittivity.

On the other hand, when the RF excited plasma is used to form the second fluorocarbon ($CFx_2$) layer, the resulting layer is formed with excessive dissociation of the film forming process gas, e.g., $C_5F_8$ gas. This is because the RF excited plasma has a higher electron temperature compared to the microwave-excited plasma. As a result, the fluorine atoms are dissociated from the second fluorocarbon ($CFx_2$) layer and unintentional generation of fluorine compounds at the interface of the second fluorocarbon ($CFx_2$) layer and other insulating or metal layers may be suppressed. Therefore, the adhesiveness between the second fluorocarbon ($CFx_2$) layer and other metal or insulating layers can be improved. In this way, number of insulating layers or metal layers exhibiting a good adhesion property while stacked on a surface of the fluorocarbon (CFx) layer is greatly improved, which results in flexibility of design and more degrees of freedom in process selection.

Furthermore, the relative permittivity of the second fluorocarbon ($CFx_2$) layer increases when RF excited plasma is used. This is mainly due to the fact that the RF excited plasma decreases relative carbon density and damages the resulting fluorocarbon ($CFx_2$) layer due to its high electron temperature. In the preferred embodiment, the increase in effective permittivity is suppressed by limiting the applied RF power within a range of a few tens of watts, e.g., 15 W to 120 W. Moreover, the increase in effective permittivity may be suppressed by stacking the second fluorocarbon ($CFx_2$) layer with the first fluorocarbon ($CFx_1$) layer that has a lower relative permittivity compared to the second fluorocarbon ($CFx_2$) layer.

The reason for choosing the lower RF power limit at 15 W is that the RF excited plasma becomes unstable within the RLSA plasma treatment device when the applied RF power is less than 15 W. On the other hand, the upper RF power limit is set to 120 W to minimize or reduce the damage of resulting fluorocarbon ($CFx_2$) layer which is caused by the RF excited plasma.

Conventionally, a parallel plate type plasma processing device is used for generating RF excited plasma. In the conventional device, the plasma is generated by applying RF power, within a range of 300 W to 400 W, between two opposite electrodes of the parallel plate type plasma processing device. However, the above-mentioned RF power is relatively high and causes damages to the resulting fluorocarbon (CFx2) layer. The damage to the resulting fluorocarbon ($CFx_2$) layer may be minimized by reducing the amount of RF power. This is achieved by using the RLSA plasma treatment device of the present invention where the maximum RF power of 120 W can be applied to the target electrodes.

According to one embodiment of the present invention, the microwave power is turned off after forming the first fluorocarbon ($CFx_1$) layer. In this way, the microwave plasma, generated within the RLSA plasma treatment device, becomes RF-excited plasma. Then, the second fluorocarbon ($CFx_2$) layer is formed over the first fluorocarbon ($CFx_1$) layer using the RF plasma.

According to another embodiment, a compositional ratio of fluorine to carbon in the second fluorocarbon layer ($F_2/C_2$) is smaller than the compositional ratio of fluorine to carbon in the first fluorocarbon layer ($F_1/C_1$).

According to yet another embodiment, a surface-modifying process is performed on a surface of the first fluorocarbon ($CFx_1$) layer to reduce fluorine concentrations on said surface prior to forming the second fluorocarbon ($CFx_2$) layer. In this embodiment, the surface-modifying step of the first fluorocarbon ($CFx_1$) layer is carried out by annealing the first fluorocarbon ($CFx_1$) layer in an argon (Ar) atmosphere with a substrate temperature of about 200° C. Other embodiments may use other techniques to reduce fluorine concentrations on the surface of the first fluorocarbon ($CFx_1$) layer. The surface modifying process of the present invention includes those more fully described in PCT application Ser. No. PCT/JP2010/000347 filed on Jan. 22, 2010, the disclosure of which hereby is incorporated herein by reference in its entirety.

According to yet another embodiment, the surface-modifying process, conducted on the surface of the first fluorocarbon ($CFx_1$), provides a third fluorocarbon ($CFx_3$) layer, wherein the compositional ratio of fluorine to carbon in the third fluorocarbon layer ($F_3/C_3$) is greater than the compositional ratio of fluorine to carbon in the second fluorocarbon layer ($F_2/C_2$) but is smaller than the compositional ratio of fluorine to carbon in the first fluorocarbon layer ($F_1/C_1$).

According to yet another embodiment, the second fluorocarbon ($CFx_2$) layer is formed on a third or underlying layer prior to forming the first fluorocarbon ($CFx_1$) layer. The first fluorocarbon ($CFx_1$) layer is then formed on the second fluorocarbon ($CFx_2$) layer. In this way, the adhesiveness between the third or underlying layer and the fluorocarbon (CFx) layer is improved. Examples of the third or underlying layer may include Si-series compound layers, e.g., silicon carbide oxide (SiCO) and silicon carbide nitride (SiCN) layers, metal layers, and C-series compound layers, e.g., amorphous carbon (aC) layer.

As described previously, the first and second fluorocarbon ($CFx_1$ and $CFx_2$) insulating layers according to the preferred embodiment of the present invention are formed using the RLSA plasma treatment device. Also, the surface-modifying process conducted on the surface of first fluorocarbon ($CFx_1$) layer may be performed using the same RLSA plasma treatment device. FIG. 1 illustrates a schematic diagram of an embodiment of the RLSA plasma treatment device 10. As shown in this figure, the RLSA plasma treatment device 10 may include a process vessel 50, a radial line slot antenna 62, and a mounting table 51.

Inside of the process vessel 50 is sectionalized into a plasma generation region R1, at the radial line slot antenna 62 side, and a film formation region R2 at the mounting table 51 side. An external microwave source 66 provides a microwave power of a predetermined frequency, e.g., 2.45 GHz, to the radial line slot antenna 62. The microwave from the microwave source 66 causes excitation of a plasma gas, e.g., an inert gas such as argon (Ar), released into the plasma generation region R1 from gas supply ports 70. The plasma gas is supplied from a plasma gas supply source 71 to the gas supply port 70, via an upper gas port 72, which is then released into the plasma generation region R1.

An external high-frequency power supply source 53 is electrically connected to the mounting table 51. The high-frequency power supply source 53 generates an RF bias power of a predetermined frequency, e.g., 400 KHz, or 13.56 MHz, for controlling ions energy that are drawn to a substrate W. As shown in FIG. 1, the high-frequency power supply 53 is connected to a lower part of the RLSA plasma treatment device 10, which is separate from an upper part of the RLSA plasma treatment device 10 where the microwave power supply 66 is connected via a coaxial waveguide 67.

The RLSA plasma treatment device 10 further includes a process gas supply structure 80, also called shower plate 80. The plan view of the process gas supply structure 80 is also shown in FIG. 1. The process gas supply structure 80 includes process gas supply pipes 81, disposed in between the plasma generation region R1 and the film forming region R2 as a grid-like shower plate facing the substrate W mounted on the mounting table 51. The process gas supply pipes 81 may include an annular pipe 81a and a grid pipe 81b. The annular pipe 81a is disposed annularly at an outer peripheral portion of the process gas supply structure 80. The grid pipe 81b is disposed such that a plurality of matrix pipes is orthogonal with each other at an inner side of the annular pipe 81a.

At a lower surface of the process gas supply structure 80, a number of process gas supply ports 83 are formed uniformly over the substrate W. A process gas supply source 84 is connected to the process gas supply pipes 81 through a gas pipe 85. In this embodiment, the process gas supply source 84 provides a mixture of nitrogen ($N_2$) gas and/or oxygen ($O_2$) gas with a CF-series process gas, e.g., $C_5F_8$, to the process gas supply pipes 81 via the gas pipe 85. Please note that the addition of nitrogen ($N_2$) gas and/or oxygen ($O_2$) gas is optional.

Experimental Samples:

In order to evaluate insulating properties, the adhesion, and also the reliable operation of fluorocarbon (CFx) insulating layer, several experimental samples are manufactured according to the process described in the present disclosure. The experimental samples are then subjected to different tests for evaluating the above-mentioned properties. In the following the results of these evaluations will be explained in detail.

Figure 2:
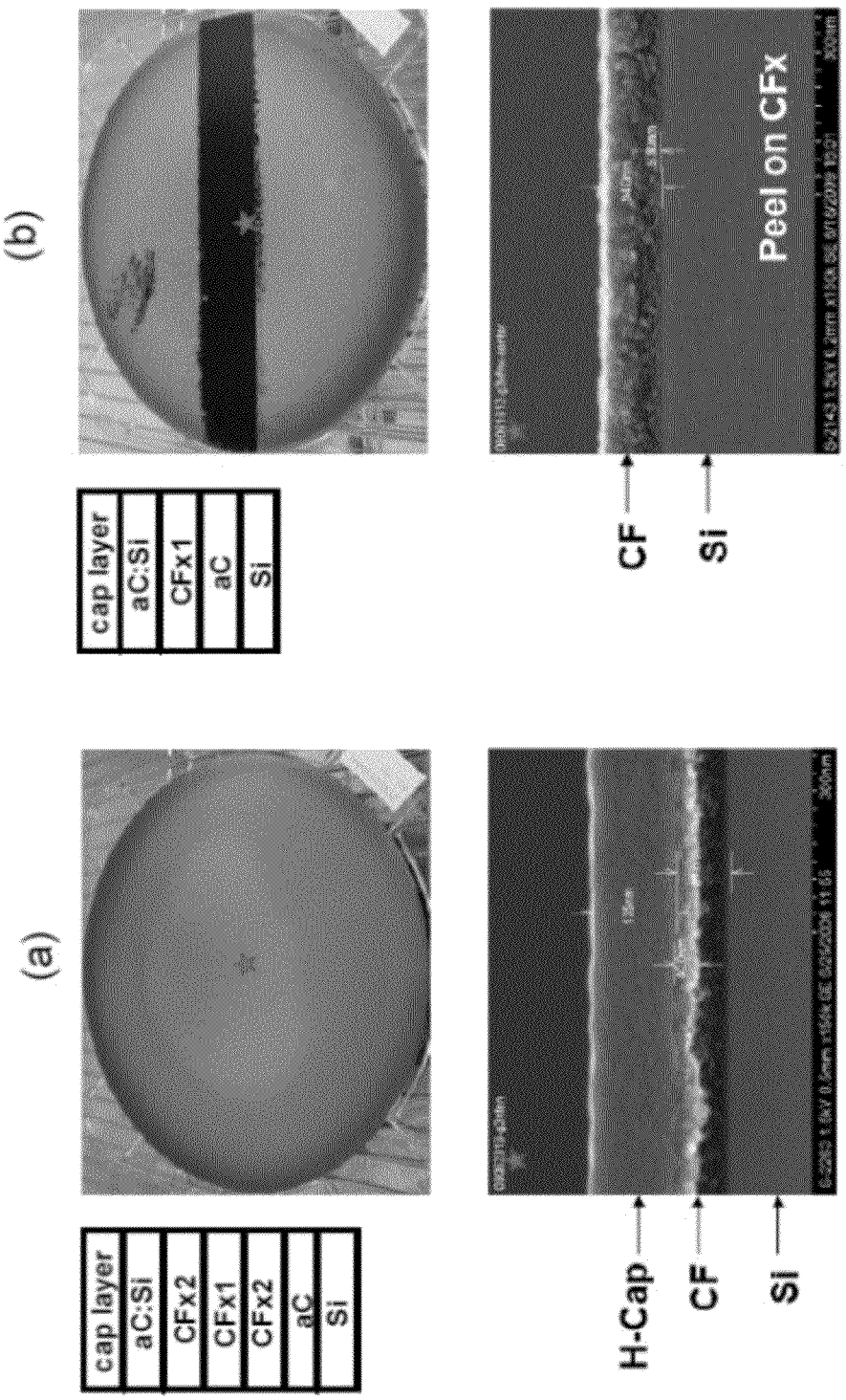
FIG. 2 illustrates target structures, cross-sectional views, and plan views of experimental samples after applying adhesive tapes, with their blister test results and tape rest results.

Referring Next to FIG. 2, target structures, cross-sectional views, and plan views of experimental samples after applying adhesive tapes are shown. To evaluate the adhesion properties of fluorocarbon (CFx) insulating layers formed by RF-excited plasma two experimental samples are manufactured with different target structures. The target structure used for the first experimental sample, (see FIG. 2(a)), includes a silicon substrate, an amorphous carbon (aC) layer, a multilayer fluorocarbon (CFx) structure, a silicon-doped amorphous carbon (aC:Si) layer, and a hermetic cap layer. The multilayer fluorocarbon (CFx) structure of FIG. 2(a) may include a second fluorocarbon ($CFx_2$) layer formed by RF-excited plasma, a first fluorocarbon ($CFx_1$) layer formed by microwave-excited plasma, and a second fluorocarbon ($CFx_2$) layer formed by RF-excited plasma.

The target structure used for the second experimental sample, (see FIG. 2(b)), includes a silicon substrate, an amorphous carbon (aC) layer, a fluorocarbon (CFx) layer formed by microwave-excited plasma, a silicon-doped amorphous carbon (aC:Si) layer, and a hermetic cap layer. The target structure used for the second experimental sample is different from the target structure of the first experimental sample in that the fluorocarbon ($CFx_1$) layer is a single layer formed by microwave-excited plasma.

Both experimental samples are then subjected to the blister test and the tape test. A plan view of both experimental samples, after adhering scotch tape to their surface and their cross-sectional views are also shown in FIG. 2. As shown in this figure, the first experimental sample with the multilayer fluorocarbon structure, having two layers formed by RF-excited plasma, passes both the tape test and the blister test. Further, no delamination or peeling of the hermetic cap layer is observed in this sample. In addition, no occurrence of blisters is observed in the CF-substrate interface. On the contrary, the second experimental sample, having the single fluorocarbon ($CFx_1$) layer formed by microwave-excited plasma, shows massive blisters in the CF-substrate interface and its hermetic cap layer is peeled off from the fluorocarbon ($CFx_1$) layer.

As described previously, the plasma excited by RF power may damage the resulting fluorocarbon ($CFx_2$) layer due to its high electron temperature. The damage to the resulting fluorocarbon ($CFx_2$) layer may be minimized by reducing the amount of applied RF power, causing the excitation of the plasma gas, e.g., argon (Ar) gas. This is achieved by selecting the second predetermined process condition of the present invention using the RLSA plasma treatment device.

Figure 3:
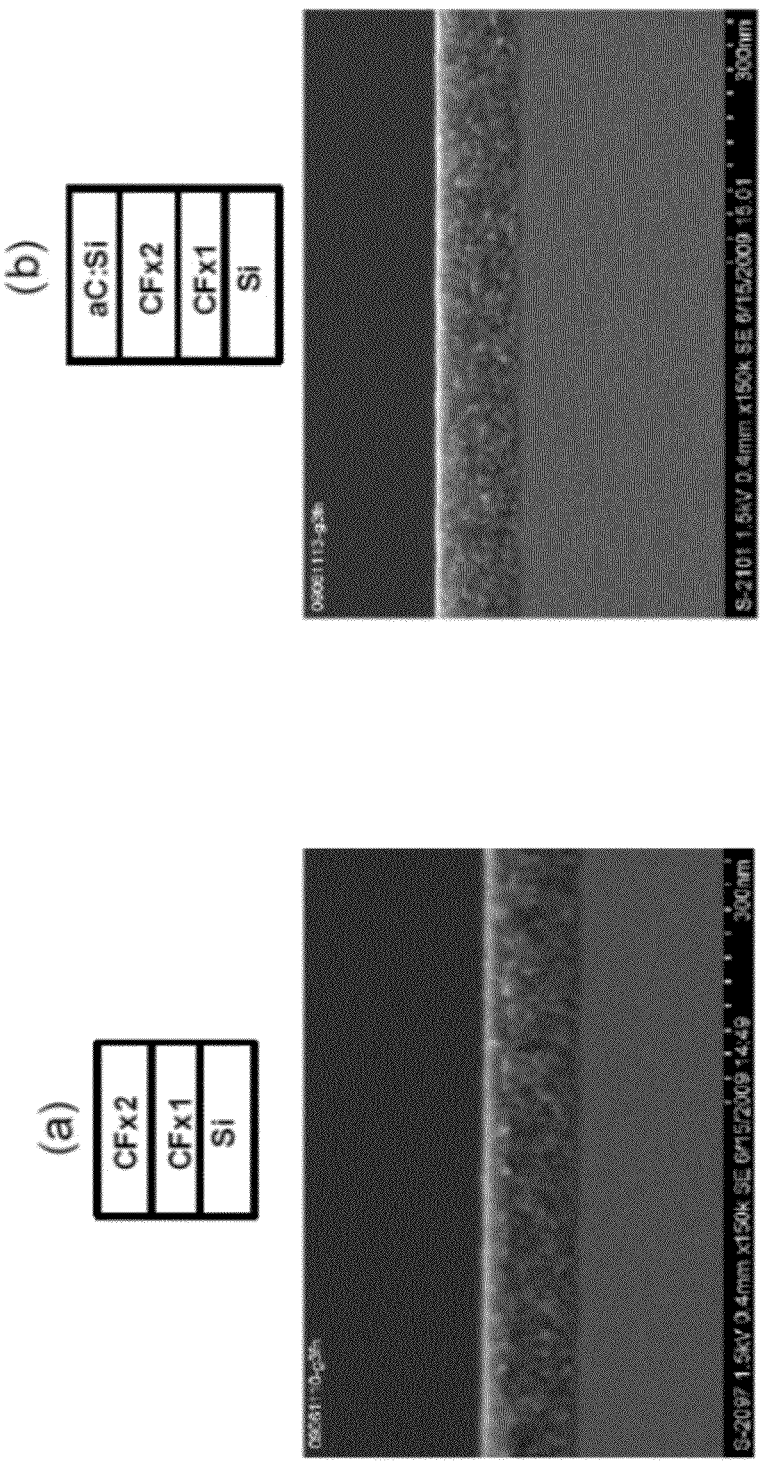
FIG. 3 illustrates target structure and cross-sectional view for various experimental samples.

In the following, the damage to the resulting fluorocarbon layer due to the RF plasma is investigated. For this purpose two experimental samples are manufactured. FIG. 3 illustrates target structure and cross-sectional view of both experimental samples. As shown in FIG. 3, the target structure of both experimental samples may include a silicon substrate, a first fluorocarbon ($CFx_1$) layer formed by microwave-excited plasma, and a second fluorocarbon ($CFx_2$) layer formed by RF excited plasma. The first fluorocarbon ($CFx_1$) layer formed by microwave-excited plasma is formed on the silicon substrate while the second fluorocarbon ($CFx_2$) layer, formed by RF excited plasma, is formed over the first ($CFx_1$) fluorocarbon layer.

The target structure of second experimental sample is different from the target structure of first experimental sample in that a cap layer made of silicon-doped amorphous carbon (aC:Si) layer is formed on the second fluorocarbon ($CFx_2$) layer. The cap layer is formed to function as a hard mask during subsequent etching and also as a barrier layer against copper diffusion. As shown in cross-sectional views FIG. 3, no damages are observed in both experimental samples.

Figure 4:
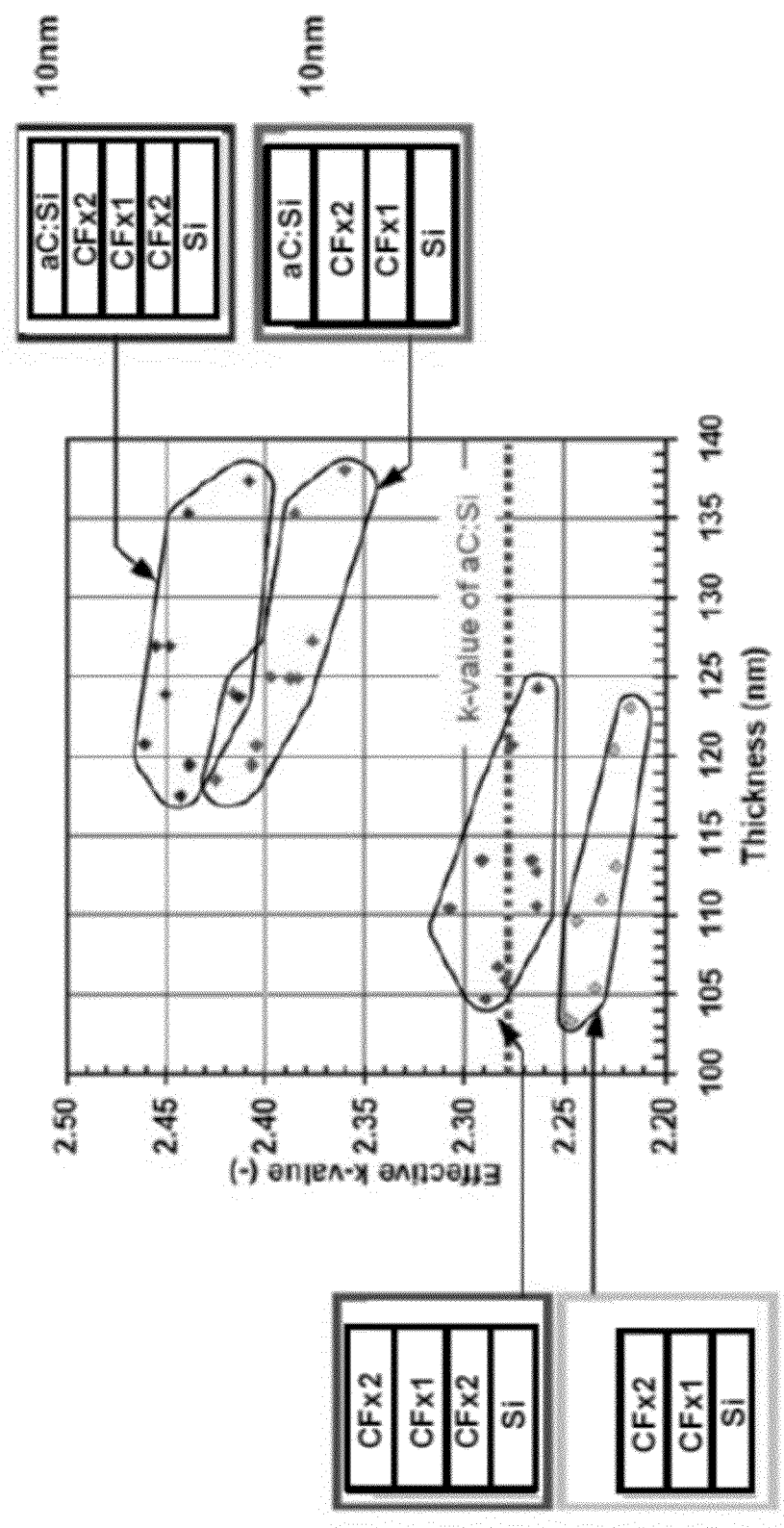
FIG. 4 illustrates relative permittivity as a function of total thickness of fluorocarbon layers for various experimental samples with different target structures.

With reference to FIG. 4, the relative permittivity as a function of total thickness of fluorocarbon (CFx) layer is shown for various experimental samples. For this evaluation, four set of experimental samples, each having a different target structures, are manufactured using the RLSA plasma treatment device 10. In each set, several experimental samples are formed with a different fluorocarbon (CFx) layer thickness while having the same target structure.

The target structure used for the first set of experimental samples may include a silicon (Si) substrate, a first fluorocarbon ($CFx_1$) layer formed by microwave-excited plasma, and a second fluorocarbon ($CFx_2$) layer formed by RF excited plasma. The target structure used for the second set of experimental samples may include a silicon (Si) substrate, a first fluorocarbon ($CFx_2$) layer formed by RF excited plasma, a second fluorocarbon ($CFx_1$) layer formed by microwave-excited plasma, and a third fluorocarbon ($CFx_2$) layer formed by RF excited plasma. This target structure is different from the target structure used for the first set of experimental samples in that the fluorocarbon ($CFx_1$) formed by the microwave-excited plasma is sandwiched between two fluorocarbon ($CFx_2$) layers formed by RF excited plasma.

The target structures used for the third and fourth set of experimental samples are respectively similar to the one used for the first and second set of experimental samples. The only difference being the deposition of a cap layer, e.g., silicon-doped amorphous carbon (aC:Si) layer, on the last fluorocarbon ($CFx_2$) layer, which is formed by RF excited plasma. Both silicon-doped amorphous carbon layers, used in the third and forth set of experimental samples, have a thickness of about 10 nm.

As shown in FIG. 4, the relative permittivity in each set of experimental samples differs depending upon the target structure used for each set of experimental samples. For example, the multilayered structure of fluorocarbon layers ($Si/CFx_1/CFx_2$ & $Si/CFx_2/CFx_1/CFx_2$) has the lowest relative permittivity (k: less than 2.4). On the other hand, the relative permittivity increases when a silicon-doped amorphous carbon (aC:Si) layer is stacked on the multilayered fluorocarbon structures ($Si/CFx_1/CFx_2/aC:Si$ & $Si/CFx_2/CFx_1/CFx_2/aC:Si$). Despite this increase, the relative permittivity remains low (k: less than 2.5) in presence of the silicon-doped amorphous carbon (aC:Si) layer. In this experiment, a single cap layer made of silicon-doped amorphous carbon materials is used. Other embodiments may use a multilayer structure in which another insulating layer such as, for example, silicon carbide Nitride (SiCN), is stacked with the amorphous carbon (aC) layer.

Furthermore, the relative permittivity decreases across all target structures when the total thickness of fluorocarbon (CFx) layer increases. According to these results, an effective permittivity of less than 2.4 may be obtained by the following process: 1) by suppressing the fluorination reaction at the interface between the amorphous carbon (aC:Si) layer and the fluorocarbon layers (CFx2), and 2) by decreasing the thickness of the silicon-doped amorphous carbon (aC:Si) cap layer.

Figure 5:
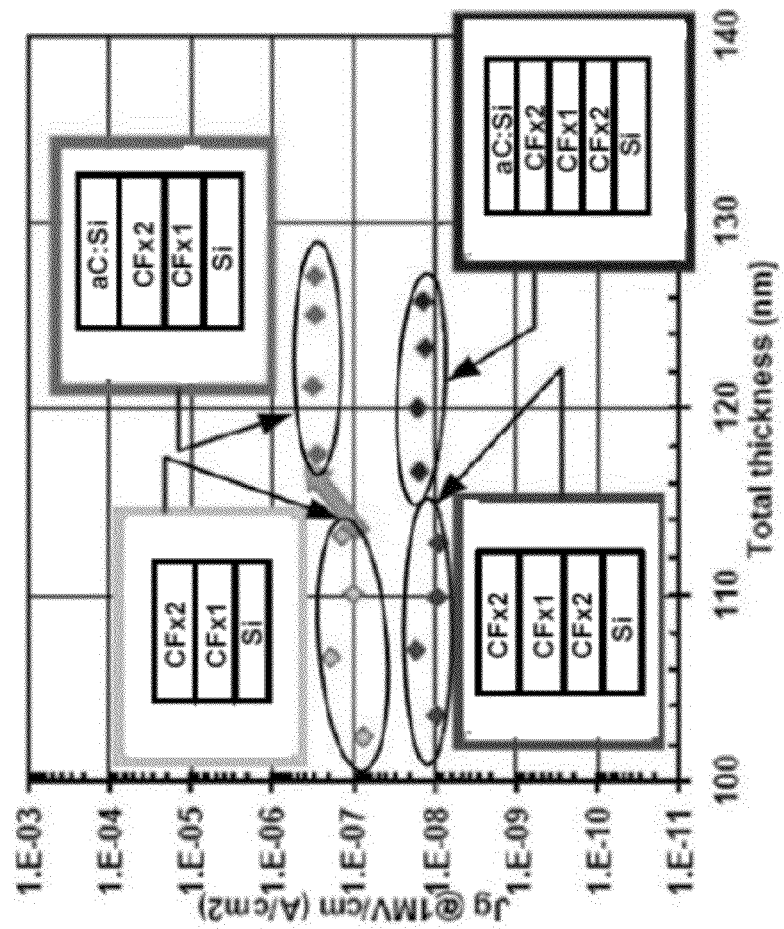
FIG. 5 illustrates leakage current as a function of total thickness of fluorocarbon layers, when a negative voltage is applied, for various experimental samples with different target structures.

FIG. 5 illustrates the leakage current as a function of total thickness of the fluorocarbon (CFx) layer. Similar to the previous experiment, four set of experimental samples, each having a different target structures, are manufactured using the RLSA plasma treatment device 10. The target structures used in each set of experimental samples are exactly the same as those used in the previous experiment. This means that the first and second set of experimental samples use the following fluorocarbon multilayered structures: 1) $Si/CFx_1/CFx_2$, 2) $Si/CFx_2/CFx_1/CFx_2$, while the third and fourth set of experimental samples use the silicon-doped amorphous carbon (aC:Si) layer stacked respectively on the first and second fluorocarbon multilayered structures: 3) $Si/CFx_1/CFx_2/aC:Si$, and 4) $Si/CFx_2/CFx_1/CFx_2/aC:Si$.

In each set, four experimental samples are formed with a different fluorocarbon (CFx) layer thickness while having the same target structure. All experimental samples are manufactured using the film forming process of the present invention. In this experiment, a negative voltage is applied to measure the leakage current of each experimental sample. As shown in FIG. 5, the thicker the fluorocarbon multilayered structure is, the lower is the value of leakage current. Therefore, the target structures used for the second and fourth set of experimental samples ($Si/CFx_2/CFx_1/CFx_2$ & $Si/CFx_2/CFx_1/CFx_2/aC:Si$) exhibit the lowest leakage current. In addition, the leakage current value does not depend on the presence of the silicon-doped amorphous carbon (aC:Si) layer when the following laminated fluorocarbon structure $CFx_2/CFx_1/CFx_2$ is used.

On the contrary, the leakage current value increases when the silicon-doped amorphous carbon (aC:Si) layer is deposited on the following multilayered fluorocarbon structure $CFx_1/CFx_2$. Further, the leakage current value remains relatively constant across all target structures when the total thickness of fluorocarbon (CFx) layer increases in each experimental sample. It should be noted that the leakage current values are measured when the applied voltage is set to 1 MV/cm (Jg@1 MV/cm).

Figure 6:
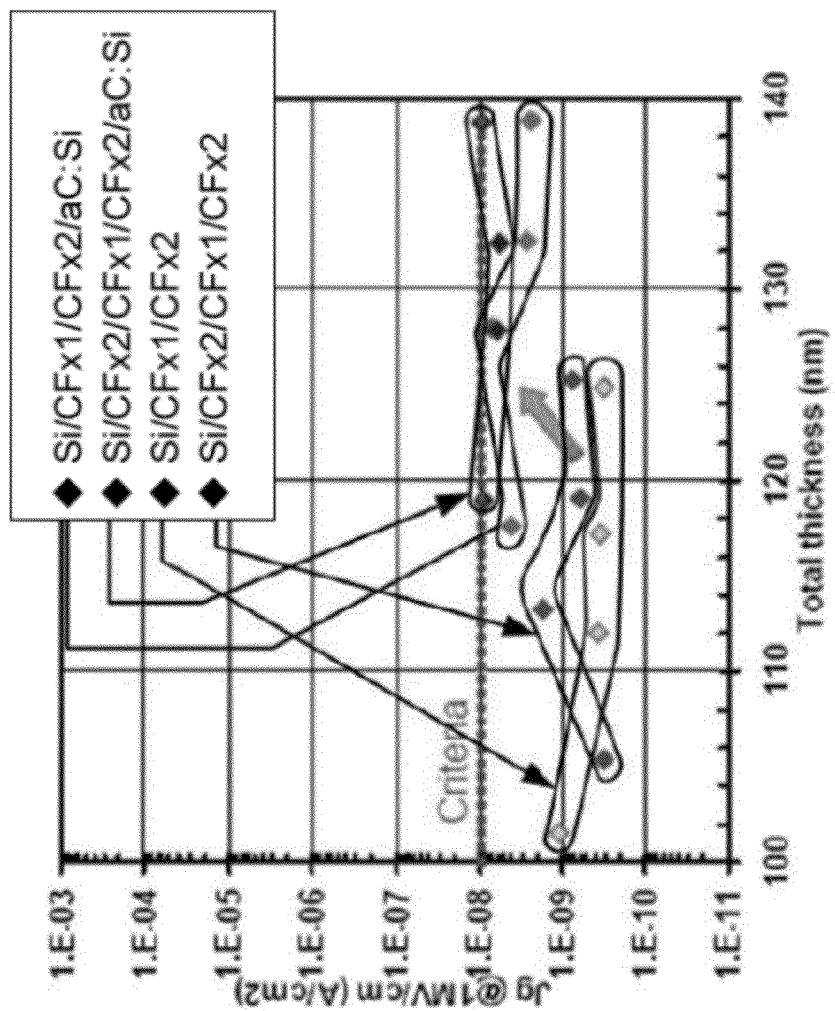
FIG. 6 illustrates leakage current as a function of total thickness of fluorocarbon layers, when a positive voltage is applied, for various experimental samples with different target structures.

Referring next to FIG. 6, the leakage current as a function of total thickness of the fluorocarbon (CFx) layer is shown when a positive voltage is applied to measure the leakage current. As shown in this figure, an increase in leakage current value is observed when the silicon-doped amorphous carbon (aC:Si) layer is deposited on both fluorocarbon multilayered structures: 1) $CFx_1/CFx_2$ and 2) $CFx_2/CFx_1/CFx_2$. However, in spite of this increase, the leakage current value remains at or below $1.0 \times 10^{-8}$ A/cm$^2$ across all four set of experimental samples.

In the following, the effect of various parameters as a function of process conditions used for forming the fluorocarbon layer using plasma excited by RF power is investigated. For this purpose, several experimental samples with different process conditions are formed.

Figure 7:
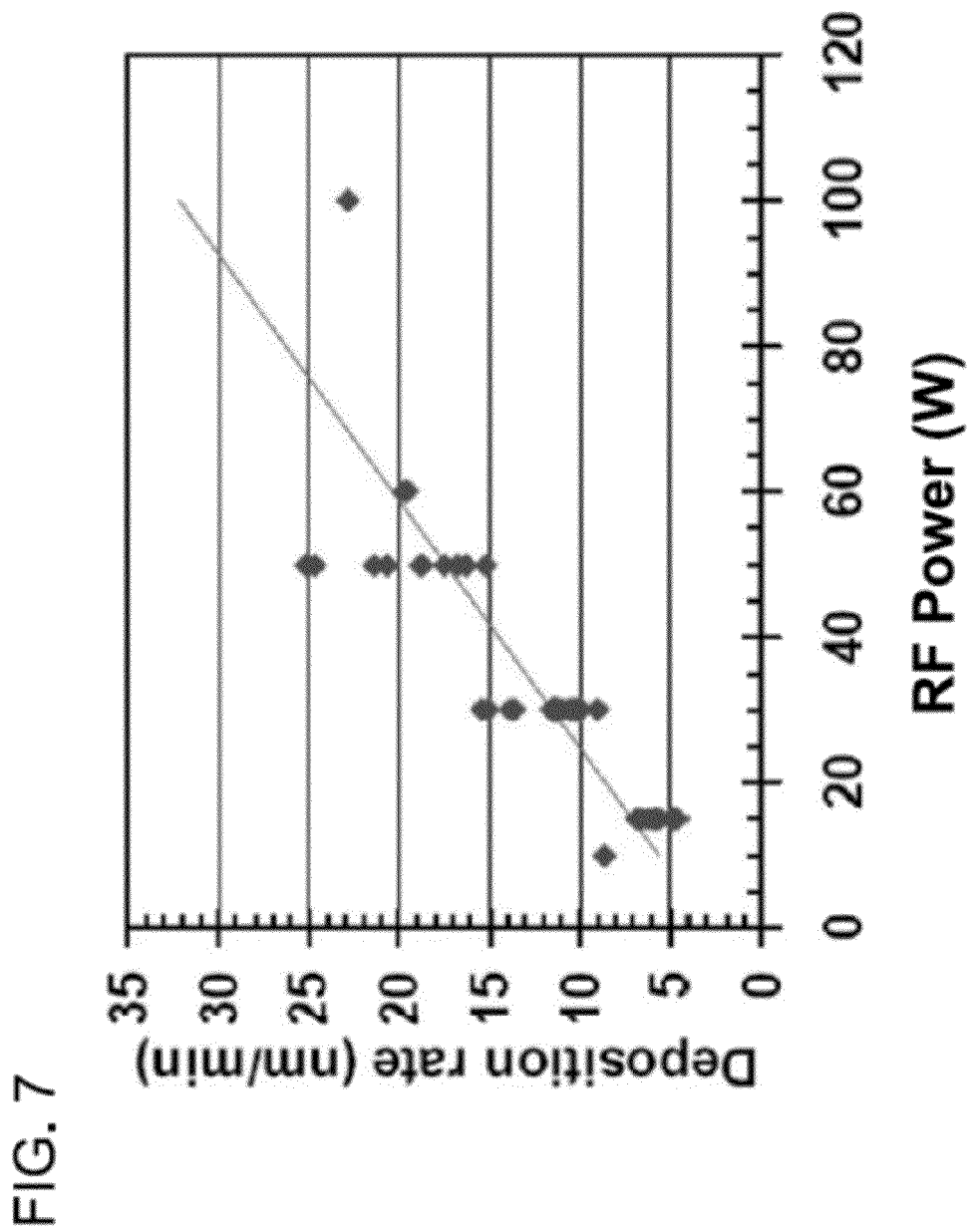
FIG. 7 illustrates deposition rate as a function of applied RF power for various experimental samples.

FIG. 7 illustrates deposition rate of fluorocarbon ($CFx_2$) layer, formed by RF excited plasma, as a function of applied RF power. All experimental samples are manufactured using the RLSA plasma treatment device 10 according to the second predetermined process condition described in paragraphs [0018]-[0019]. In this experiment three set of experimental samples are formed where the applied RF power is set respectively to at the following powers: 15 W, 30 W, 50 W. Further, two more experimental samples are formed with the following applied RF power: 60 W, and 100 W. As shown in FIG. 7, the deposition rate of fluorocarbon ($CFx_2$) layer tends to increase when the applied RF power increases.

Figure 8:
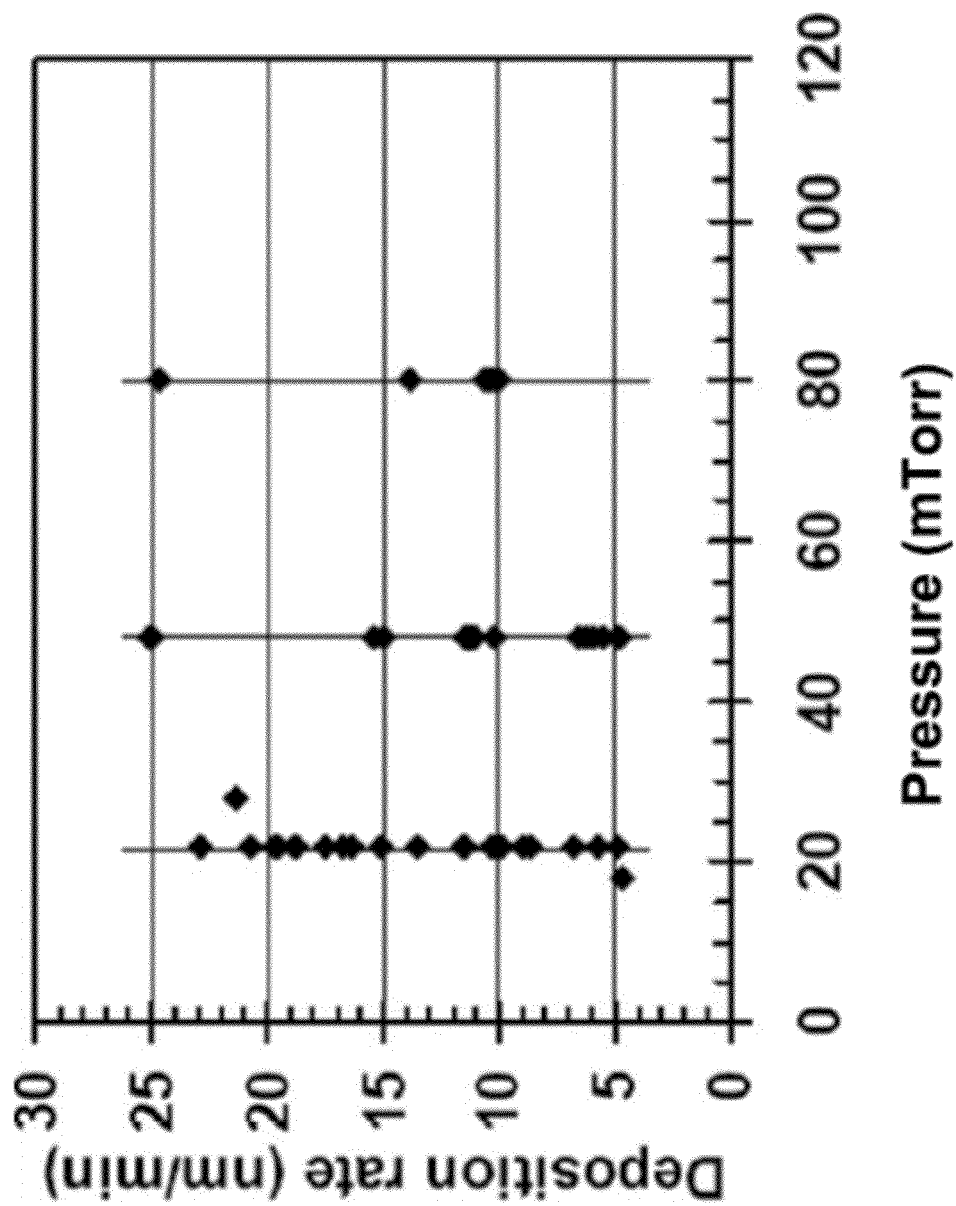
FIG. 8 illustrates deposition rate as a function of pressure for various experimental samples.

Referring next to FIG. 8, deposition rate of fluorocarbon ($CFx_2$) layer as a function of pressure is shown for various experimental samples. For this evaluation, three set of experimental samples are formed using the RLSA plasma treatment device 10. In each set, various experimental samples are formed under the following pressures: 20 mTorr, 50 mTorr, and 80 mTorr. The measurement results for deposition rate of fluorocarbon ($CFx_2$) layer formed according to the process of present invention are shown in FIG. 8.

As shown in this figure, the fluorocarbon ($CFx_2$) deposition rate tends to remain relatively constant, for the first and second set of experimental samples, which means when the pressure is set to 20 mTorr and 50 mTorr. However, for the third set of experimental samples, when the pressure is set to 80 mTorr, the fluorocarbon ($CFx_2$) deposition rate tends to increase. Therefore, according to these results, it is preferable to use a lower pressure value for forming the fluorocarbon layer according to the process of the present invention. Moreover, according to these results, the fluorocarbon ($CFx_2$) deposition rate can be freely adjusted by changing the pressure condition within the second predetermined process condition. In other words, any deposition rate may be selected under any pressure of: 20 mTorr, 50 mTorr, or 80 mTorr.

Figure 9:
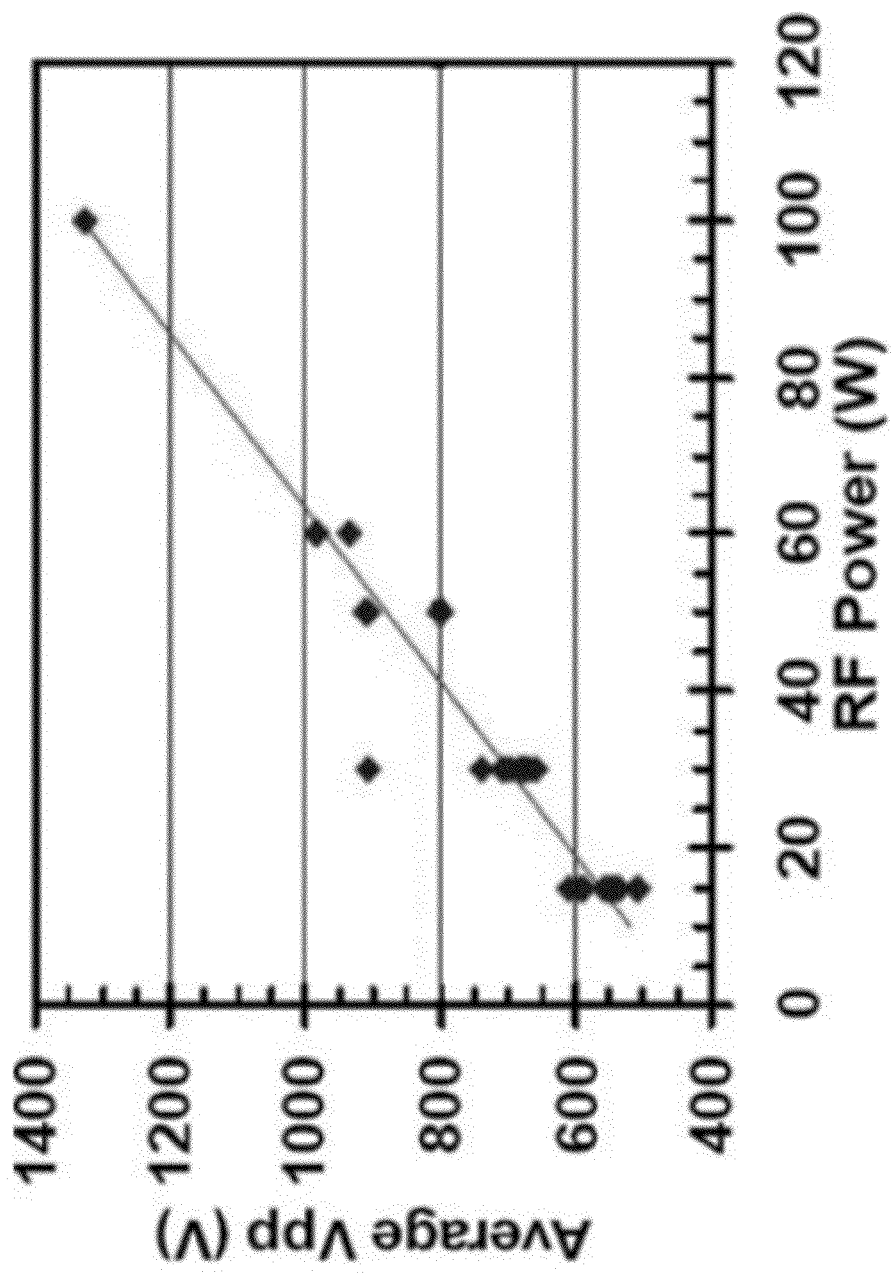
FIG. 9 illustrates average RF peak-to-peak voltage as a function of applied RF power for various experimental samples.

The average RF peak-to-peak voltage (Vpp) as a function of applied RF power is shown in FIG. 9. As shown in this figure, the average RF peak-to-peak voltage (Vpp) tends to increase when the applied RF power increases. However, as discussed previously, increasing the applied RF power increases the possibility of damaging the resulting fluorocarbon ($CFx_2$) layer. Therefore, it is preferable to apply a lower RF power value such that the average RF peak-to-peat voltage (Vpp) remains below 800V, which corresponds to an applied RF power of about 40 W.

Figure 10:
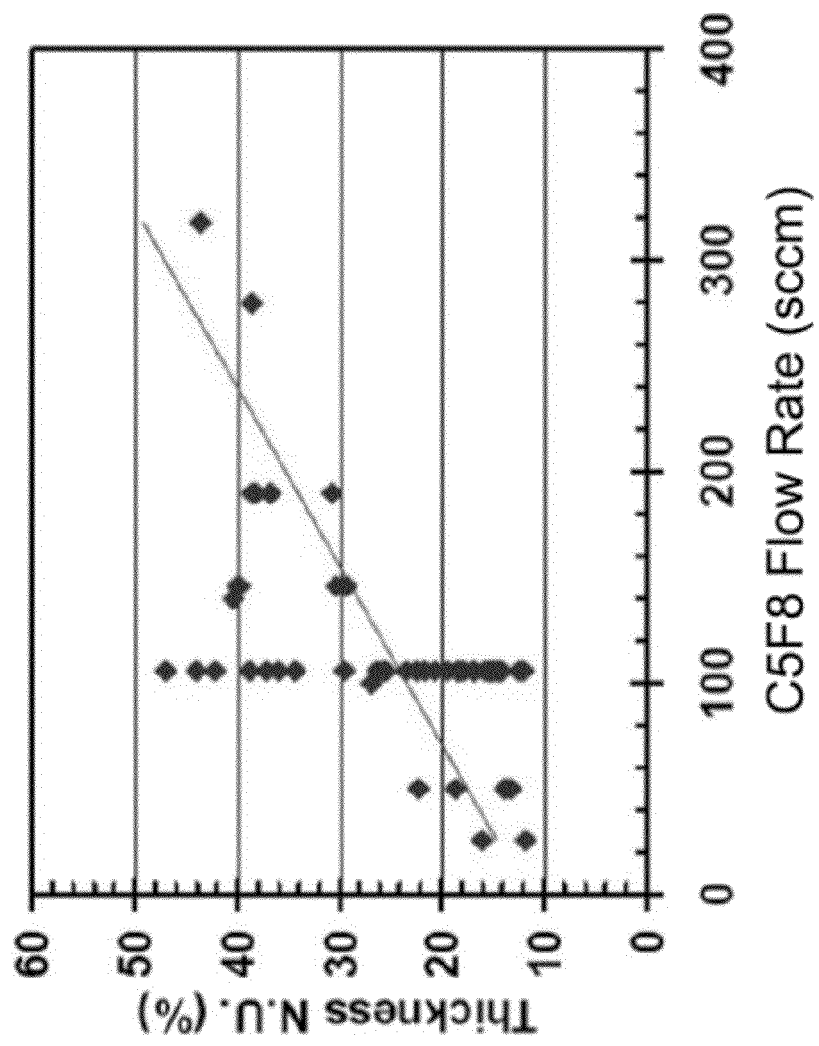
FIG. 10 illustrates thickness of fluorocarbon layer as a function of process gas ($C_5F_8$) flow rate for various experimental samples.

With reference to FIG. 10, the thickness of fluorocarbon (CFx2) layer as a function $C_5F_8$ flow rate is shown for various experimental samples. For this purpose, five set of experimental samples are formed using the RLSA plasma treatment device 10. In each set, several experimental samples are formed under the flowing $C_5F_8$ flow rate: 20 sccm, 60 sccm, 100 sccm, 140 sccm, and 200 sccm. Further, two more experimental samples are formed where the $C_5F_8$ flow rate is set respectively to 280 sccm and 310 sccm. As shown in FIG. 10, the thickness of fluorocarbon ($CFx_2$) layer tends to increase when the flow rate of the $C_5F_8$ film forming process gas increases. However, it is preferable to use a lower $C_5F_8$ flow rate when forming fluorocarbon layers using plasma excited by RF power. This is mainly because the lower $C_5F_8$ flow rate allows for better control of the second fluorocarbon ($CFx_2$) layers in terms of their thickness uniformity.

In the following, an alternative embodiment is evaluated to improve even further the properties of the second fluorocarbon ($CFx_2$) insulating layer. More specifically, the alternative embodiment allows a lower value of permittivity (k: less than 2.3) for the second fluorocarbon ($CFx_2$) layers. In this embodiment, oxygen ($O_2$) gas is introduced through the process gas supply 81, also called grid-like shower plate 81, via the gas pipe 85 into the process vessel 50 of the RLSA plasma treatment device 10.

To evaluate the effectiveness of this alternative embodiment, four set of experimental samples are manufactured. Table I summarizes each set of experimental samples and power sources used to generate plasma for forming different fluorocarbon layers.

TABLE I

Power sources and additive gas used for forming experimental samples

| Experimental sample | Microwave Power | RF Power | Additive gas |
|---|---|---|---|
| #1 | yes | — | — |
| #2 | yes | yes | — |
| #3 | — | yes | — |
| #4 | — | yes | Oxygen ($O_2$) |

As shown in Table I, the first set of experimental samples correspond to the first fluorocarbon ($CFx_1$) layer where only microwave power is used to generate the plasma within the process vessel 50. Accordingly, the second set of experimental samples correspond to $CFx_4$ layers where both microwave power and RF power are used simultaneously to generate plasma within the process vessel 50 for forming the fluorocarbon ($CFx_4$) layers. The third and fourth set of experimental samples correspond, respectively, to the second fluorocarbon ($CFx_2$ and $CFx_{20}$) layers where only RF power is used to generate the plasma within the process vessel 50.

The fourth set is different from the third set of experimental samples in that the process gas supply source 84 provides a mixture of oxygen ($O_2$) gas with the $C_5F_8$ gas through the grid-like shower plate 81 (please refer to FIG. 1). In this alternative embodiment, the RF power source is applied at a frequency of about 400 kHz with an RF power ranging from 15 W to 120 W. It should be noted that a higher frequency range such as, for example, 13.56 MHz is also applicable.

Figure 11:
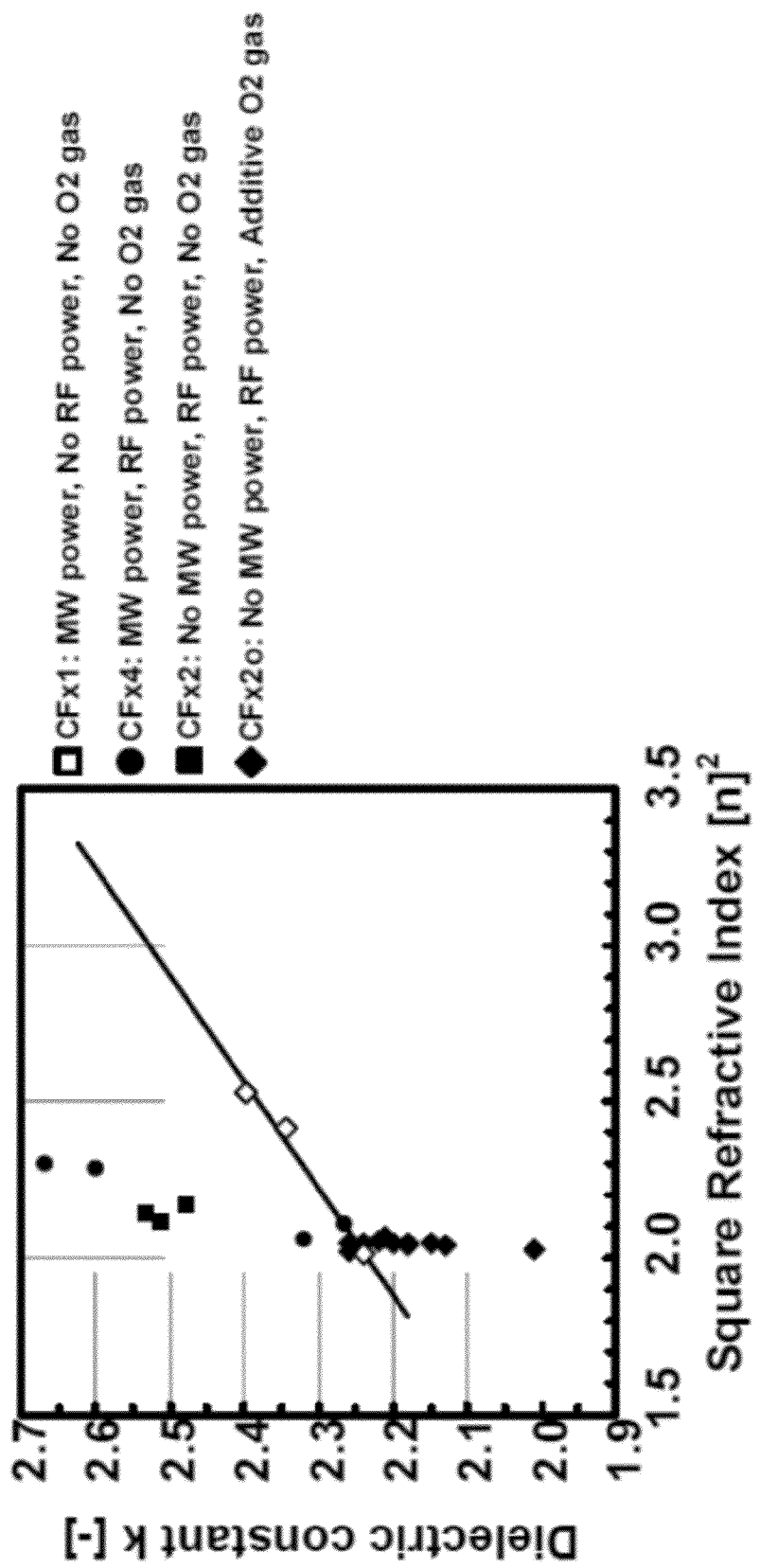
FIG. 11 illustrates dielectric constant as a function of refractive index for various experimental samples.

By adding oxygen ($O_2$) gas into the atmosphere, the resulting second fluorocarbon ($CFx_2$) layer becomes more porous, which results, in turn, to a lower value of permittivity. FIG. 11 illustrates dielectric constant as a function of refractive index for various experimental samples. As shown in this figure, the value of dielectric constant are lower for the fourth set of experimental samples where oxygen ($O_2$) gas is added into the atmosphere of the process vessel 50. This result in a lower permittivity (low-k) for the fourth set of experimental sample (k: less than about 2.25).

While the principles of the disclosure have been described above in connection with specific apparatuses and methods, it is to be clearly understood that this description is made only by way of example and not as limitation on the scope of the invention.

What is claimed is:

1. A method for manufacturing a semiconductor device having fluorocarbon layers as insulating layers, the method comprising the steps of:
    forming a first fluorocarbon ($CFx_1$) layer using a plasma excited by microwave power; and
    forming a second fluorocarbon ($CFx_2$) layer using a plasma excited by RF power,
    wherein the first fluorocarbon layer ($CFx_1$) is formed over a substrate and the second fluorocarbon ($CFx_2$) layer is formed on the first fluorocarbon ($CFx_1$) layer, and conducting a surface-modifying process on a surface of the first fluorocarbon ($CFx_1$) layer so as to reduce fluorine compounds on said surface prior to forming the second fluorocarbon ($CFx_2$) layer.

2. The method as recited in claim 1, wherein the step of conducting the surface-modifying process comprises a step of exposing the surface of the first fluorocarbon layer ($CFx_1$) to a plasma excited by the RF power in an argon atmosphere.

3. The method as recited in claim 1, wherein the first fluorocarbon ($CFx_1$) layer is formed under a microwave power ranging from 1200 W to 3000 W, an RF power ranging from 0 W to 120 W, a pressure ranging from 20 mTorr to 80 mTorr with a processing time ranging from 20 seconds to 150 seconds.

4. The method as recited in claim 3, wherein the first fluorocarbon ($CFx_1$) layer has a thickness of about 100 nm.

5. The method as recited in claim 1, wherein the second fluorocarbon ($CFx_2$) layer is formed under a microwave power ranging from 0 W to 1000 W, an RF power ranging from 15 W to 120 W, a pressure ranging from 20 mTorr to 80 mTorr with a processing time ranging from 5 seconds to 60 seconds.

6. The method as recited in claim 5, wherein the second fluorocarbon ($CFx_2$) layer has a thickness ranging from about 0 nm to 10 nm.

7. The method as recited in claim 1, wherein the second fluorocarbon ($CFx_2$) layer is formed by a fluorocarbon-containing gas and an oxygen-containing gas.

8. A method of forming fluorocarbon layers using a plasma reaction process, the method comprising the steps of:
    forming a first fluorocarbon ($CFx_1$) layer using a plasma excited by microwave power; and
    forming a second fluorocarbon ($CFx_2$) layer using a plasma excited by RF power,
    wherein the first fluorocarbon layer ($CFx_1$) is formed over a substrate and the second fluorocarbon ($CFx_2$) layer is formed on the first fluorocarbon ($CFx_1$) layer, and conducting a surface-modifying process on a surface of the first fluorocarbon ($CFx_1$) layer so as to reduce fluorine compounds on said surface prior to forming the second fluorocarbon ($CFx_2$) layer.

9. The method as recited in claim 8, wherein the step of conducting the surface-modifying process comprises a step of exposing the surface of the first fluorocarbon layer ($CFx_1$) to a plasma excited by an RF power in an argon atmosphere.

10. The method as recited in claim 8, wherein the first fluorocarbon ($CFx_1$) layer is formed under a microwave power ranging from 1200 W to 3000 W, an RF power ranging from 0 W to 120 W, a pressure ranging from 20 mTorr to 80 mTorr with a processing time ranging from 20 seconds to 150 seconds.

11. The method as recited in claim 10, wherein the first fluorocarbon ($CFx_1$) layer has a thickness of about 100 nm.

12. The method as recited in claim 8, wherein the second fluorocarbon ($CFx_2$) layer is formed under a microwave power ranging from 0 W to 1000 W, an RF power ranging from 15 W to 120 W, a pressure ranging from 20 mTorr to 80 mTorr with a processing time ranging from 5 seconds to 60 seconds.

13. The method as recited in claim 12, wherein the second fluorocarbon ($CFx_2$) layer has a thickness ranging from about 0 nm to 10 nm.

14. A method of forming fluorocarbon layers using a plasma reaction process, the method comprising the steps of:
    forming a first fluorocarbon ($CFx_1$) layer using a plasma excited by microwave power; and
    forming a second fluorocarbon ($CFx_2$) layer using a plasma excited by RF power, wherein a compositional ratio of fluorine to carbon in the second fluorocarbon layer ($F_2/C_2$) is smaller than the compositional ratio of fluorine to carbon in the first fluorocarbon layer ($F_1/C_1$).

15. The method as recited in claim 14, wherein the first fluorocarbon layer ($CFx_1$) is formed over a substrate and the second fluorocarbon ($CFx_2$) layer is formed on the first fluorocarbon ($CFx_1$) layer.

16. The method as recited in claim 14, further comprising forming a third layer on the second fluorocarbon ($CFx_2$) layer, wherein the second fluorocarbon ($CFx_2$) layer is formed on the first fluorocarbon ($CFx_1$) layer, which is formed on a substrate.

17. The method as recited in claim 14, further comprising forming a third fluorocarbon ($CFx_3$) layer between the first fluorocarbon ($CFx_1$) layer and the second fluorocarbon ($CFx_2$) layer, wherein the compositional ratio of fluorine to carbon in the third fluorocarbon layer ($F_3/C_3$) is greater than the compositional ratio of fluorine to carbon in the second fluorocarbon layer ($F_2/C_2$) and smaller than the compositional ratio of fluorine to carbon in the first fluorocarbon layer ($F_1/C_1$).

18. The method as recited in claim 14, further comprising forming a third layer between a semiconductor substrate and the second fluorocarbon ($CFx_2$) layer, wherein the first fluorocarbon ($CFx_1$) layer is formed on the second fluorocarbon ($CFx_2$) layer.

19. The method as recited in claim 14, wherein the second fluorocarbon ($CFx_2$) layer is porous and substantially contains oxygen atoms.

20. The method as recited in claim 14, wherein the second fluorocarbon ($CFx_2$) layer is formed prior to forming the first fluorocarbon ($CFx_1$) layer on a third layer deposited over the substrate, and the first fluorocarbon ($CFx_1$) layer is formed on the second fluorocarbon ($CFx_2$) layer.

21. The method as recited in claim 14, further comprising a step of conducting a surface-modifying process on a surface of the first fluorocarbon ($CFx_1$) layer so as to reduce fluorine compounds on said surface prior to forming the second fluorocarbon ($CFx_2$) layer.

22. The method as recited in claim 21, wherein the step of conducting the surface-modifying process comprises a step of exposing the surface of the first fluorocarbon layer ($CFx_1$) to a plasma excited by an RF power in an argon atmosphere.

23. The method as recited in claim 8, wherein the second fluorocarbon ($CFx_2$) layer is porous and substantially contains oxygen atoms.

24. The method as recited in claim 14, wherein the second fluorocarbon ($CFx_2$) layer is porous and substantially contains oxygen atoms.

\* \* \* \* \*